(12) United States Patent
Baek (10) Patent No.: US 11,139,360 B2
(45) Date of Patent: Oct. 5, 2021

(54) DISPLAY PANEL INCLUDING DISPLAY SIGNAL PADS AND SENSING SIGNAL PADS MOUNTED ON THE DISPLAY PANEL SIDEWALL

(71) Applicant: Samsung Display Co., Ltd., Yongin-si (KR)

(72) Inventor: Seung Ho Baek, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 95 days.

(21) Appl. No.: 16/168,609

(22) Filed: Oct. 23, 2018

(65) Prior Publication Data

US 2019/0206970 A1 Jul. 4, 2019

(30) Foreign Application Priority Data

Dec. 28, 2017 (KR) .......................... 10-2017-0181968

(51) Int. Cl.
*H01L 27/32* (2006.01)
*H01L 51/52* (2006.01)
*G06F 3/041* (2006.01)
*G06F 3/044* (2006.01)

(52) U.S. Cl.
CPC .......... *H01L 27/3276* (2013.01); *G06F 3/044* (2013.01); *G06F 3/04164* (2019.05); *H01L 51/5256* (2013.01); *G06F 3/0412* (2013.01); *G06F 3/0443* (2019.05); *G06F 2203/04112* (2013.01); *H01L 27/323* (2013.01)

(58) Field of Classification Search
None
See application file for complete search history.

(56) References Cited

U.S. PATENT DOCUMENTS

| 2013/0135229 A1* | 5/2013 | Wang .................... G06F 1/1643 345/173 |
| 2014/0339574 A1* | 11/2014 | Kang ................ G02F 1/133305 257/88 |
| 2015/0049030 A1* | 2/2015 | Her ....................... G06F 3/0412 345/173 |

(Continued)

FOREIGN PATENT DOCUMENTS

| JP | 2000-259091 A | 9/2000 |
| JP | 2007-242941 A | 9/2007 |

(Continued)

*Primary Examiner* — Erik Kielin
(74) *Attorney, Agent, or Firm* — Lewis Roca Rothgerber Christie LLP (57) ABSTRACT

Provided is a display panel. The display panel includes a base layer in which a display area where a plurality of pixels are disposed and a non-display area surrounding the display area are defined; a circuit element layer which is disposed on the base layer; an input sensing layer which is disposed on the circuit element layer; and one or more display signal pads and one or more sensing signal pads which are disposed on a sidewall of each of the base layer, the circuit element layer and the input sensing layer, wherein each of the display signal pads is electrically coupled to a display signal line disposed in the circuit element layer, and each of the sensing signal pads is electrically coupled to an input sensing line disposed in the input sensing layer.

20 Claims, 9 Drawing Sheets

(56) References Cited

U.S. PATENT DOCUMENTS

| | | | |
|---|---|---|---|
| 2016/0092015 A1* | 3/2016 | Al-Dahle | G06F 3/044 345/174 |
| 2016/0216736 A1* | 7/2016 | Hong | G06F 3/0412 |
| 2016/0299370 A1* | 10/2016 | Wu | G02F 1/1368 |
| 2016/0321996 A1* | 11/2016 | Lee | H01L 27/3248 |
| 2017/0005083 A1* | 1/2017 | Choi | H01L 27/124 |
| 2017/0017108 A1* | 1/2017 | Shin | G09G 3/3406 |
| 2018/0358413 A1* | 12/2018 | Lee | H01L 27/3276 |

FOREIGN PATENT DOCUMENTS

| | | |
|---|---|---|
| JP | 3180669 U | 12/2012 |
| KR | 10-2005-0019994 A | 3/2005 |
| KR | 10-1309862 B1 | 9/2013 |
| KR | 10-2014-0136233 A | 11/2014 |
| KR | 10-2014-0136237 A | 11/2014 |
| KR | 10-2014-0136238 A | 11/2014 |
| KR | 10-2015-0011731 A | 2/2015 |
| KR | 10-2016-0127276 A | 11/2016 |
| KR | 10-2017-0005341 A | 1/2017 |

* cited by examiner

DISPLAY PANEL INCLUDING DISPLAY SIGNAL PADS AND SENSING SIGNAL PADS MOUNTED ON THE DISPLAY PANEL SIDEWALL

CROSS-REFERENCE TO RELATED APPLICATION

This application claims priority to and the benefit of Korean Patent Application No. 10-2017-0181968, filed on Dec. 28, 2017, in the Korean Intellectual Property Office, the entire content of which is incorporated herein by reference.

BACKGROUND

1. Field

Embodiments of the present disclosure relate to a display panel.

2. Description of the Related Art

With the rapid development of the display field for visually expressing a variety of electrical signal information, various display devices having excellent characteristics such as thin and lightweight characteristics, low power consumption and flexibility are being researched and developed.

Such a display device includes a display area which displays an image and a peripheral area in which wirings for delivering signals to the display area are disposed. Currently, research is being actively conducted to reduce the size of the peripheral area while maintaining the high quality of the display device.

However, it is difficult to realize a display device having a thin bezel due to pads for signal transmission located in a non-display portion surrounding a display portion in which an image is displayed.

For example, when a touch function is embedded in a display device, a signal transmission pad for implementing the touch function is additionally required, which makes it difficult to realize a display device having a thin bezel.

SUMMARY

Aspects of embodiments of the present disclosure provide a display panel in which the position of pads for signal transmission is adjusted to produce a display device having a thin bezel.

However, aspects of embodiments of the present disclosure are not restricted to the one set forth herein. The above and other aspects of embodiments of the present disclosure will become more apparent to one of ordinary skill in the art to which the present disclosure pertains by referencing the detailed description given below.

An embodiment may be related a display panel. The display panel includes a base layer in which a display area where a plurality of pixels are disposed and a non-display area surrounding the display area are defined; a circuit element layer which is disposed on the base layer; an input sensing layer which is disposed on the circuit element layer; and one or more display signal pads and one or more sensing signal pads which are disposed on a sidewall of each of the base layer, the circuit element layer and the input sensing layer, wherein each of the display signal pads is electrically coupled to a display signal line disposed in the circuit element layer, and each of the sensing signal pads is electrically coupled to an input sensing line disposed in the input sensing layer.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Example embodiments are described with reference to the accompanying drawings. The example embodiments may be embodied in many different forms and should not be construed as being limited to the description herein. Like reference numerals may refer to like elements in the description.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

When a first element is referred to as being "on", "connected to" or "coupled to" a second element or layer, the first element can be directly on, connected or coupled to the second element, or one or more intervening elements may be present between the first element and the second element. In contrast, when a first element is referred to as being "directly on", "directly connected to" or "directly coupled to" a second element or layer, there are no intended intervening elements (except environmental elements such as air) present between the first element and the second element. The term "and/or" may include any and all combinations of one or more of the associated items.

Throughout the specification, identical or similar parts will be referred to with identical reference numerals.

Hereinafter, embodiments will be described with reference to the attached drawings.

Figure 1:
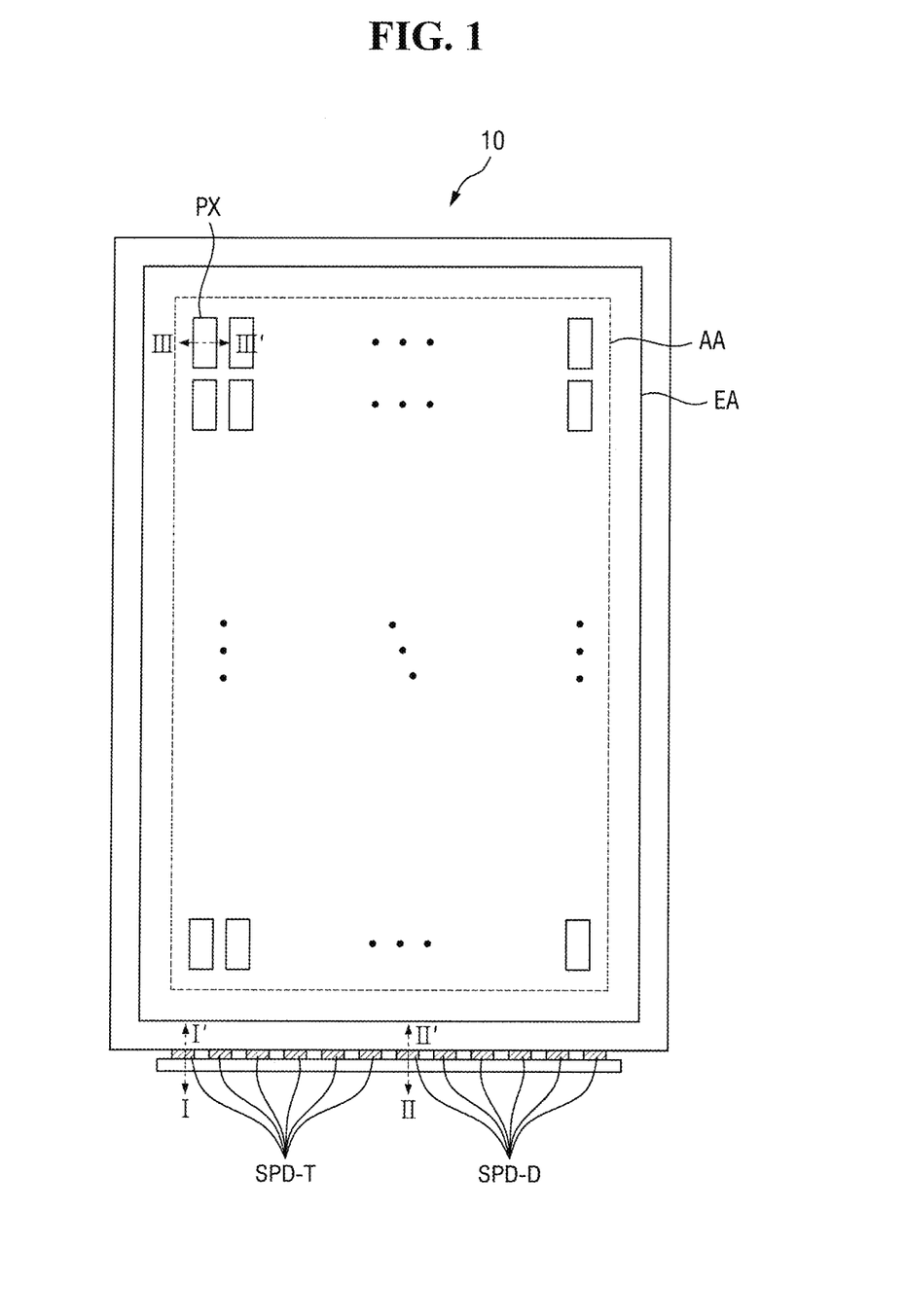
FIG. 1 is a layout view of a display panel of a display device according to an embodiment.
Figure 2:
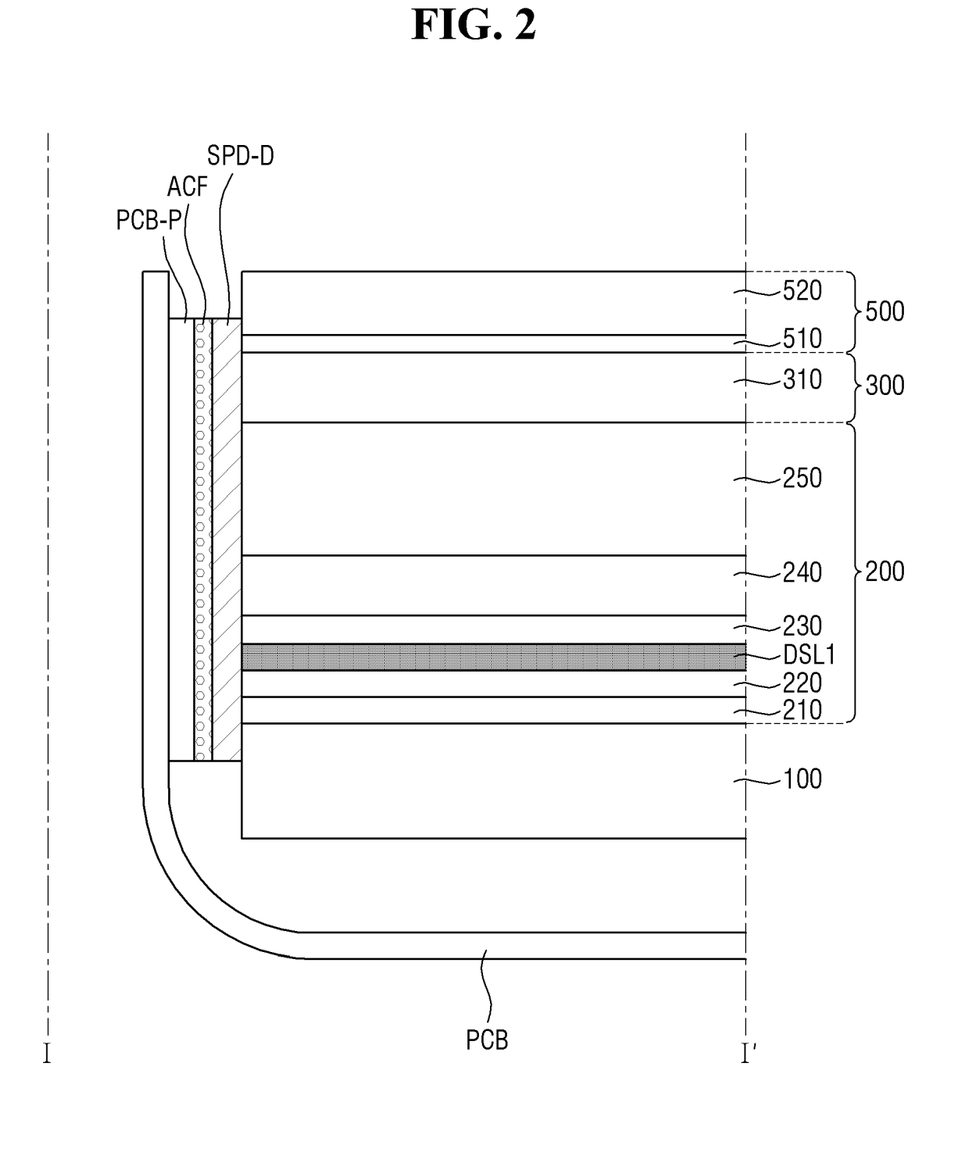
FIG. 2 is a cross-sectional view taken along the line I-I' of FIG. 1.
Figure 3:
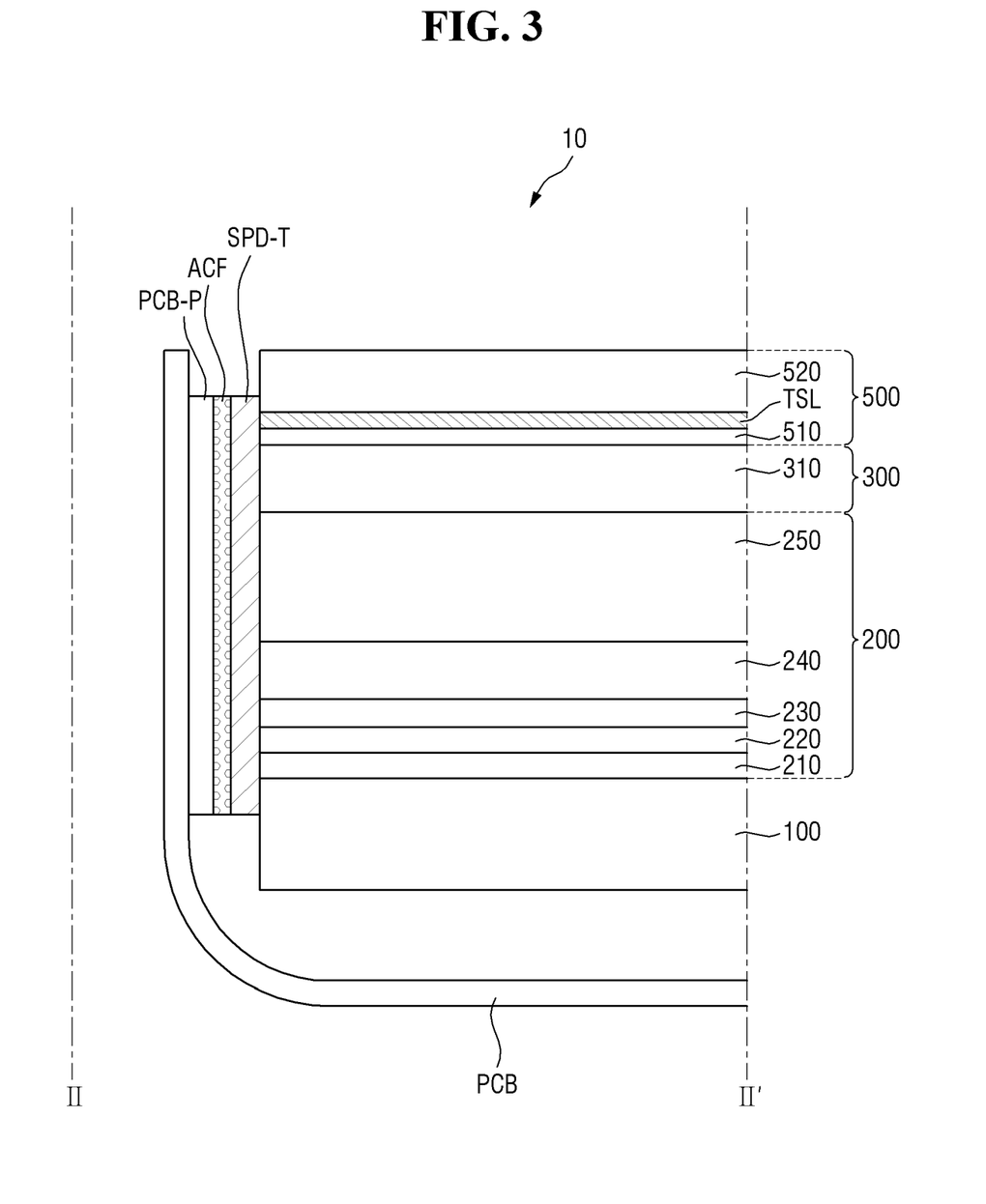
FIG. 3 is a cross-sectional view taken along the line II-II' of FIG. 1.
Figure 4:
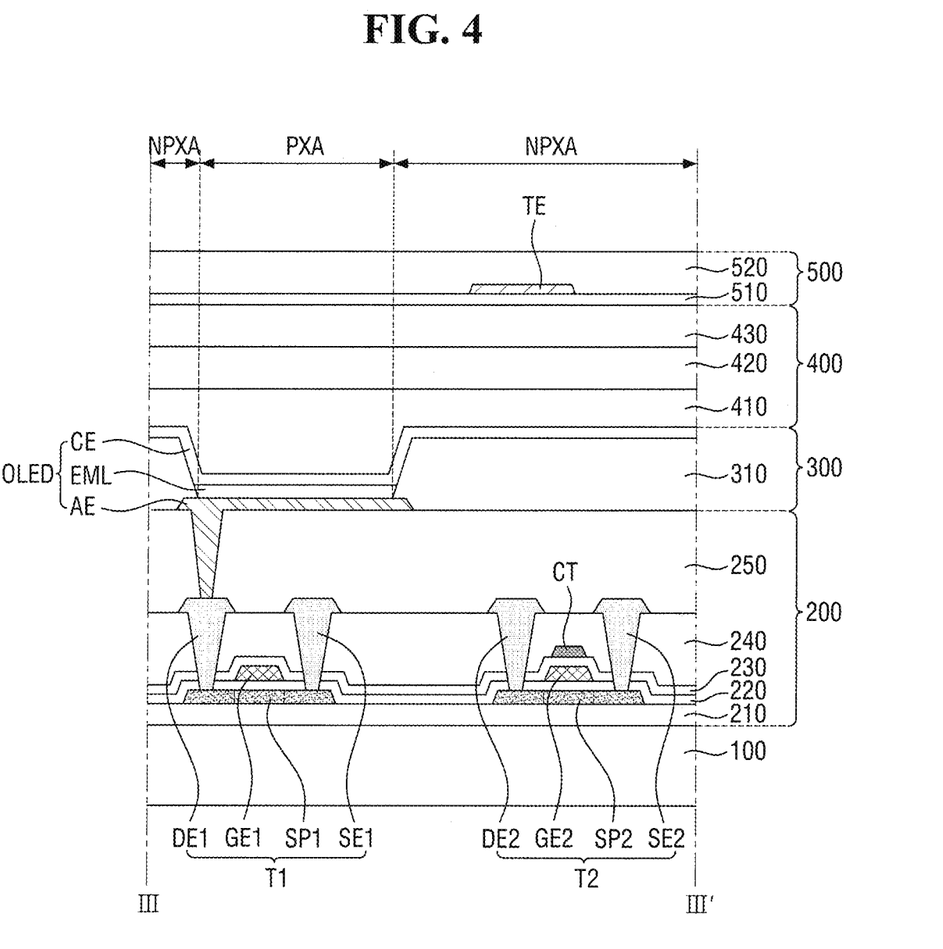
FIG. 4 is a cross-sectional view taken along the line III-III' of FIG. 1.
Figure 5:
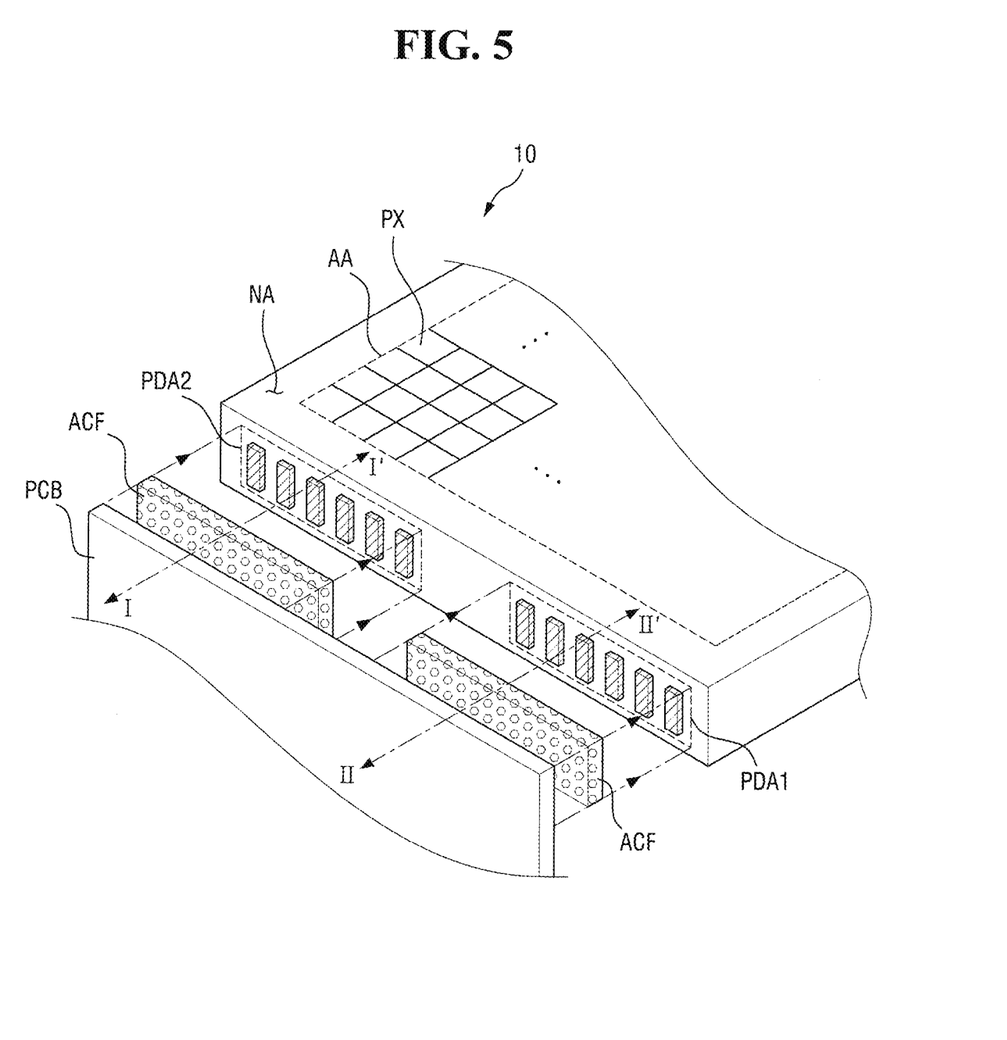
FIG. 5 is a perspective view of the display panel according to the embodiment related to FIG. 1.

FIG. 1 is a layout view of a display panel 10 of a display device according to an embodiment. FIG. 2 is a cross-sectional view taken along the line I-I' of FIG. 1. FIG. 3 is a cross-sectional view taken along the line II-II' of FIG. 1. FIG. 4 is a cross-sectional view taken along the line III-III' of FIG. 1. FIG. 5 is a perspective view of the display panel 10 according to the embodiment related to FIG. 1.

Referring to FIG. 1, the display panel 10 includes a display area AA and a non-display area NA in a plane. In the current embodiment, the non-display area NA may be defined along the edges of the display area AA.

In addition, a thin-film encapsulating area EA which overlaps the display area AA and overlaps a part of the non-display area NA is defined. Based on FIG. 1, the thin-film encapsulating area EA defines an area in which a thin-film encapsulating layer 400 to be described later is disposed.

The display panel 10 may include a driver circuit, a plurality of signal lines, a plurality of signal pads, and a plurality of pixels PX. The pixels PX are disposed in the display area AA to realize an image. Each of the pixels PX includes an organic light emitting diode and a pixel driver circuit coupled to (e.g., connected to) the organic light emitting diode. The driver circuit, the signal lines, the signal pads, and the pixel driver circuit may be included in a circuit element layer 200 illustrated in FIG. 4.

A circuit board PCB may be a rigid circuit board or a flexible circuit board. The circuit board PCB may be directly coupled to the display panel 20 or may be coupled to (e.g., connected to) the display panel 10 by another circuit board.

A timing control circuit for controlling the operation of the display panel 10 may be disposed on the circuit board PCB. In addition, an input sensing circuit for controlling an input sensing layer 500 may be disposed on the circuit board PCB. Each of the timing control circuit and the input sensing circuit may be mounted on the circuit board PCB in the form of an integrated chip. The circuit board PCB may include a plurality of circuit board pads PCB-P electrically coupled to (e.g., electrically connected to) the display panel 10. The circuit board PCB further includes signal lines coupling (e.g., connecting) the circuit board pads PCB-P to the timing control circuit and/or the input sensing circuit.

The signal pads may be disposed on a sidewall of the display panel 10. Here, the signal pads include a plurality of display signal pads SPD-D to which signals for controlling the driving of the pixels PX are provided and a plurality of sensing signal pads SPD-T to which signals for controlling the driving of an input sensing unit are provided. The display signal pads SPD-D and the sensing signal pads SPD-T may be arranged in different areas. For example, the display signal pads SPD-D may be disposed in a first pad area PDA1 on the sidewall of the display panel 10, and the sensing signal pads SPD-T may be disposed on the sidewall of the display panel 10 and in a second pad area PDA2 separated from the first pad area PDA1.

The display signal pads SPD-D and the sensing signal pads SPD-T may be coupled to (e.g., connected to) the circuit board pads PCB-P in a state where the circuit board PCB for providing signals received from the outside to the display panel 10 is placed parallel (e.g., substantially parallel) to the sidewall of the display panel 10. Therefore, the display signal pads SPD-D and the sensing signal pads SPD-T can be designed free from space restraints due to the bending of the circuit board PCB. This makes it possible to provide the display panel 10 having a thin bezel.

Furthermore, since the sensing signal pads SPD-T can be coupled to (e.g., connected to) the circuit board pads PCB-P without via a conductive layer disposed in the circuit element layer 200 to be described later, a signal provision path can be minimized (or reduced), and the display panel 10 having a thinner bezel can be realized.

The display signal pads SPD-D and the sensing signal pads SPD-T may be electrically coupled (e.g., electrically connected) and fixed to the circuit board pads PCB-P by an anisotropic conductive film ACF.

The anisotropic conductive film ACF may include a polymer and conductive particles contained in the polymer. The conductive particles may be disposed between the pads on both sides to allow electrical conduction between the conductive pads through the conductive particles. In addition, the anisotropic conductive film ACF may be adhesive on both surfaces to make the circuit board pads PCB-P adhered and fixed to the sidewall of the display panel 10.

Each element of the display panel 10 will hereinafter be described based on the cross-sectional structure of the display panel 10.

The display panel 10 includes a base layer 100, the circuit element layer 200 disposed on the base layer 100, a display element layer 300, the thin-film encapsulating layer 400, and the input sensing layer 500. The display panel 10 may further include functional layers such as an anti-reflection layer and a refractive index control layer.

The base layer 100 may include a synthetic resin film. A synthetic resin layer is formed on a working substrate used in manufacturing the display panel 10. Then, a conductive layer and an insulating layer are formed on the synthetic resin layer. If the working substrate is removed, the synthetic resin layer corresponds to the base layer 100. The synthetic resin layer may be a polyimide resin layer, and the material of the synthetic resin layer is not particularly limited. In addition, the base layer 100 may include an organic substrate, a metal substrate, or an organic/inorganic composite material substrate.

The circuit element layer 200 is disposed on the base layer 100. In the current embodiment, the circuit element layer 200 includes a buffer film 210 which is an inorganic film, a first intermediate inorganic film 220, a second intermediate inorganic film 230, a third intermediate inorganic film 240, and an intermediate organic film 250. The material of each of the first intermediate inorganic film 220, the second intermediate inorganic film 230, the third intermediate inorganic film 240 and the intermediate organic film 250 is not particularly limited, and the buffer film 210 is optional.

A semiconductor pattern (hereinafter, referred to as a first semiconductor pattern SP1) of a first transistor T1 and a semiconductor pattern (hereinafter, referred to as a second semiconductor pattern SP2) of a second transistor T2 are disposed on the buffer film 210. Here, the first transistor T1 may be a driving transistor of each pixel PX, and the second transistor T2 may be a switching transistor of each pixel PX. The driving transistor may be a transistor that serves as a passage through which a current flows to the organic light emitting diode, and the switching transistor may be a transistor that determines whether to apply a voltage required for controlling the driving transistor. The first semiconductor pattern SP1 and the second semiconductor pattern SP2 may be selected from amorphous silicon, polysilicon, and metal oxide semiconductors.

The first intermediate inorganic film 220 is disposed on the first semiconductor pattern SP1 and the second semiconductor pattern SP2.

A control electrode (hereinafter, referred to as a first control electrode GE1) of the first transistor T1 and a control electrode (hereinafter, referred to as a second control electrode GE2) of the second transistor T2 are disposed on the first intermediate inorganic film 220. The first control electrode GE1 and the second control electrode GE2 may be manufactured by the same (e.g., substantially the same) photolithography process.

In the non-display area NA, a first display signal line DSL1 is disposed on the first intermediate inorganic film 220. The first display signal line DSL1 extends to be exposed on one sidewall of the display panel 10. The first display signal line DSL1 exposed on one sidewall of the display panel 10 may be in contact with and thus electrically coupled to (e.g., electrically connected to) the display signal pads SPD-D.

The second intermediate inorganic film 230 is disposed on the first intermediate inorganic film 220 to cover the first control electrode GE1 and the second control electrode GE2.

A storage electrode CT is disposed on the second intermediate inorganic film 230. The storage electrode CT may form a set (e.g., predetermined) capacitance with the second control electrode GE2 to maintain a voltage.

The third intermediate inorganic film 240 is disposed on the second intermediate inorganic film 230 to cover the second control electrode GE2.

An input electrode (hereinafter, referred to as a first input electrode DE1) and an output electrode (hereinafter, referred to as a first output electrode SE1) of the first transistor T1 and an input electrode (hereinafter, referred to as a second input electrode DE2) and an output electrode (hereinafter, referred to as a second output electrode SE2) of the second transistor T2 are disposed on the third intermediate inorganic film 240.

The intermediate organic film 250 is disposed on the third intermediate inorganic film 240 to cover the first input electrode DE1, the second input electrode DE2, the first output electrode SE1 and the second output electrode SE2. The intermediate organic film 250 may provide a flat surface.

The display element layer 300 is disposed on the intermediate organic film 250. The display element layer 300 may include a pixel defining layer 310 and an organic light emitting diode OLED. The pixel defining layer 310 may include an organic material. A first electrode AE is disposed on the intermediate organic film 250. The first electrode AE passes through the intermediate organic film 250 to be coupled to (e.g., connected to) the first input electrode DE1. An opening OP is defined in the pixel defining layer 310. The opening OP of the pixel defining layer 310 exposes at least a portion of the first electrode AE. In an embodiment, the pixel defining layer 310 may be omitted.

The pixels PX may be disposed in the display area AA. The display area AA may include a light emitting area PXA and a non-light emitting area NPXA adjacent to the light emitting area PXA. The non-light emitting area NPXA may surround the light emitting area PXA. In the current embodiment, the light emitting area PXA is defined to correspond to a portion of the first electrode AE which is exposed by the opening OP.

A light emitting layer EML is disposed on the first electrode AE. The light emitting layer EML may be disposed in an area corresponding to the opening OP. For example, the light emitting layer EML may be divided into separate portions respectively formed in the pixels PX. The light emitting layer EML may include an organic material and/or an inorganic material. The light emitting layer EML may generate light of a set (e.g., predetermined) color.

Although the patterned light emitting layer EML is illustrated in the current embodiment, the light emitting layer EML can also be entirely disposed in the pixels PX. In this case, the light emitting layer EML may generate white light. In addition, the light emitting layer EML may have a multilayer structure called a tandem.

A second electrode CE is disposed on the light emitting layer EML. The second electrode CE is entirely disposed in the pixels PX.

The thin-film encapsulating layer 400 is disposed on the second electrode CE. The thin-film encapsulating layer 400 is entirely disposed in the pixels PX. In the current embodiment, the thin-film encapsulating layer 400 directly covers the second electrode CE. In an embodiment, a capping layer covering the second electrode CE may be further disposed between the thin-film encapsulating layer 400 and the second electrode CE. In this case, the thin-film encapsulating layer 400 may directly cover the capping layer.

The thin-film encapsulating layer 400 may include (n−1) encapsulating organic films, and the (n−1) encapsulating organic films may be alternately arranged with n encapsulating inorganic films, where n is a positive integer. On average, the (n−1) encapsulating organic films may be thicker than then encapsulating inorganic films.

Each of the n encapsulating inorganic films may be a single layer containing one material or may have multiple layers, each containing a different material. The (n−1) encapsulating organic films may be formed by depositing organic monomers. For example, the organic monomers may include acrylic monomers.

In the current embodiment, one encapsulating organic film 420 and two encapsulating inorganic films 410 and 430 constitute the thin-film encapsulating layer 400.

Further, in an embodiment, the thin-film encapsulating layer 400 may include a silicon oxynitride layer, an organic monomer layer and a silicon nitride layer sequentially stacked on the second electrode CE. Another inorganic layer can be disposed on the silicon nitride layer, and the silicon nitride layer can have multiple layers (e.g., two layers) deposited under different conditions.

The input sensing layer 500 is disposed on the thin-film encapsulating layer 400. An element such as an anti-reflection unit or a window unit can be additionally disposed on the input sensing layer 500.

In the current embodiment, an input sensing unit in the form of a "layer" is described and referred to as the input sensing layer 500. The input sensing layer 500 is disposed directly on a base surface provided by the display panel 10. Therefore, unlike in an input sensing unit in the form of a "panel," a base layer is omitted, thus reducing the thickness of the entire display panel 10. In the current embodiment, the base surface may be an upper surface of the thin-film encapsulating layer 400.

In some embodiments, the thin-film encapsulating layer 400 may be omitted. In this case, the input sensing unit may be in the form of a "panel" and further include a cover layer corresponding to the base layer 100. Here, the base layer 100 and the cover layer may be rigid.

The input sensing layer 500 may have a multilayer structure. The input sensing layer 500 includes a sensing electrode, a signal line coupled to (e.g., connected to) the sensing electrode, and at least one insulating layer. The input sensing layer 500 may sense an external input using, for example, a capacitive method. However, the operation method of the input sensing layer 500 is not particularly limited. In an embodiment, the input sensing layer 500 may sense an external input using an electromagnetic induction method or a pressure sensing method.

The input sensing layer 500 according to the current embodiment includes a first insulating layer 510, a sensing electrode TE, a sensing signal line TSL, and a second insulating layer 520. Each of the first insulating layer 510, the sensing electrode TE, the sensing signal line TSL and the second insulating layer 520 may have a single layer structure or may have a multilayer structure in which at least two layers are stacked. A conductive layer having a single layer structure may include a metal layer or a transparent conductive layer. The metal layer may include molybdenum, silver, titanium, copper, aluminum, or an alloy of these materials. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include a conductive polymer such as PEDOT, metal nanowires, graphene, or the like.

A conductive layer having a multilayer structure may include multiple metal layers. The multiple metal layers may have a three-layer structure of, e.g., titanium/aluminum/titanium. The conductive layer having the multilayer structure may include at least one metal layer and at least one transparent conductive layer.

The stacked structure and material of the sensing electrode TE may be determined in consideration of sensing sensitivity. In the current embodiment, only one metal layer in which the sensing electrode TE and the sensing signal line TSL are disposed is illustrated. However, the input sensing layer 500 can have a structure in which a plurality of metal layers are stacked in various suitable forms.

The sensing electrode TE including a metal layer may have a mesh shape in order not to be seen by a user. The sensing electrode TE having a mesh shape may be disposed only in the non-light emitting area NPXA. However, embodiments are not limited to this case, and the sensing electrode TE can be formed in the shape of a plane.

At least any one of the first insulating layer 510 and the second insulating layer 520 may include an inorganic film. The inorganic film may include at least one of aluminum oxide, titanium oxide, silicon oxide, silicon oxynitride, zirconium oxide, and hafnium oxide.

At least any one of the first insulating layer 510 and the second insulating layer 520 may include an organic film. The organic film may include at least any one of acrylic resin, methacrylic resin, polyisoprene, vinyl resin, epoxy resin, urethane resin, cellulose resin, siloxane resin, polyimide resin, polyamide resin, and perylene resin.

In the non-display area NA, the sense signal line TSL is disposed on the first insulating layer 510. The sensing signal line TSL extends to be exposed on one sidewall of the display panel 10. The sensing signal line TSL exposed on one sidewall of the display panel 10 may be in contact with and thus electrically coupled to (e.g., electrically connected to) each of the sensing signal pads SPD-T.

For example, since the sensing signal line TSL can be coupled to (e.g., connected to) the circuit board pads PCB-P without via a conductive layer disposed in the circuit element layer 200, a signal provision path can be minimized (or reduced), and the display panel 10 having a thinner bezel can be provided.

Figure 6:
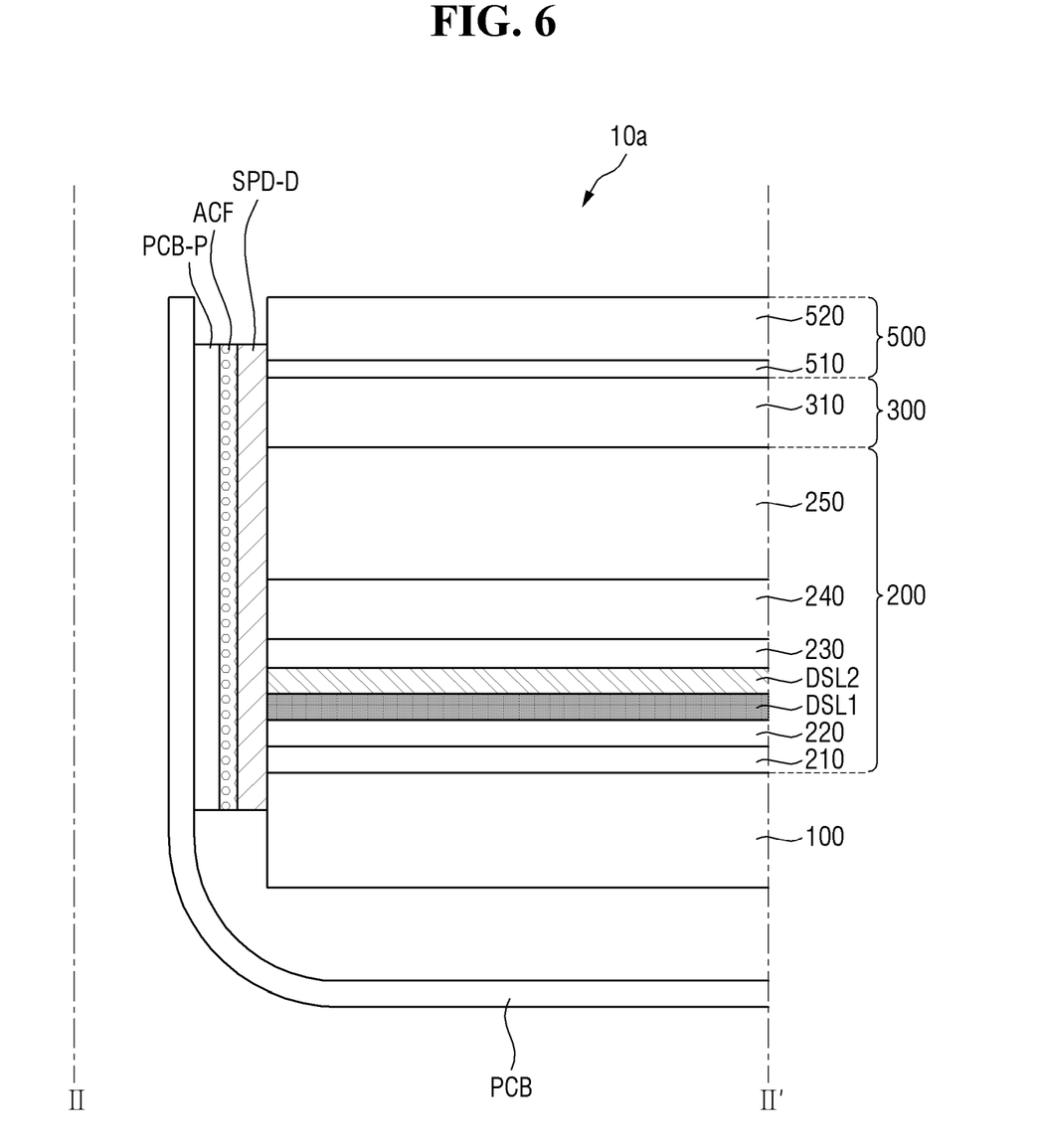
FIG. 6 is a cross-sectional view of a display panel according to an embodiment, taken along a line corresponding to the line II-II' of FIG. 1.

FIG. 6 is a cross-sectional view of a display panel 10*a* according to an embodiment, taken along a line corresponding to the line II-II' of FIG. 1.

The display panel 10*a* according to the current embodiment is different from the display panel 10 (see FIG. 1) according to the embodiment of FIGS. 1 through 5 in that it further includes a second display signal line DSL2. Therefore, the second display signal line DSL2 will be mainly described in the current embodiment, and a description of elements and reference numerals identical to those described above will be omitted or simplified.

Referring to FIG. 6, the display panel 10*a* according to the current embodiment further includes the second display signal line DSL2 disposed on a first display signal line DSL1 in a non-display area NA.

The second display signal line DSL2 may be formed of the same (e.g., substantially the same) material and on the same layer as a storage electrode CT disposed in a display area AA.

The second display signal line DSL2 overlaps the first display signal line DSL1. Thus, the second display signal line DSL2 and the first display signal line DSL1 function as one line. Accordingly, since both the first display signal line DSL1 and the second display signal line DSL2 deliver various suitable signals required for controlling pixels PX, durability can be improved. For example, it is possible to minimize (or reduce) the lifting of the first display signal line DSL1 or the second display signal line DSL2 due to stretching of a base layer 100.

Figure 7:
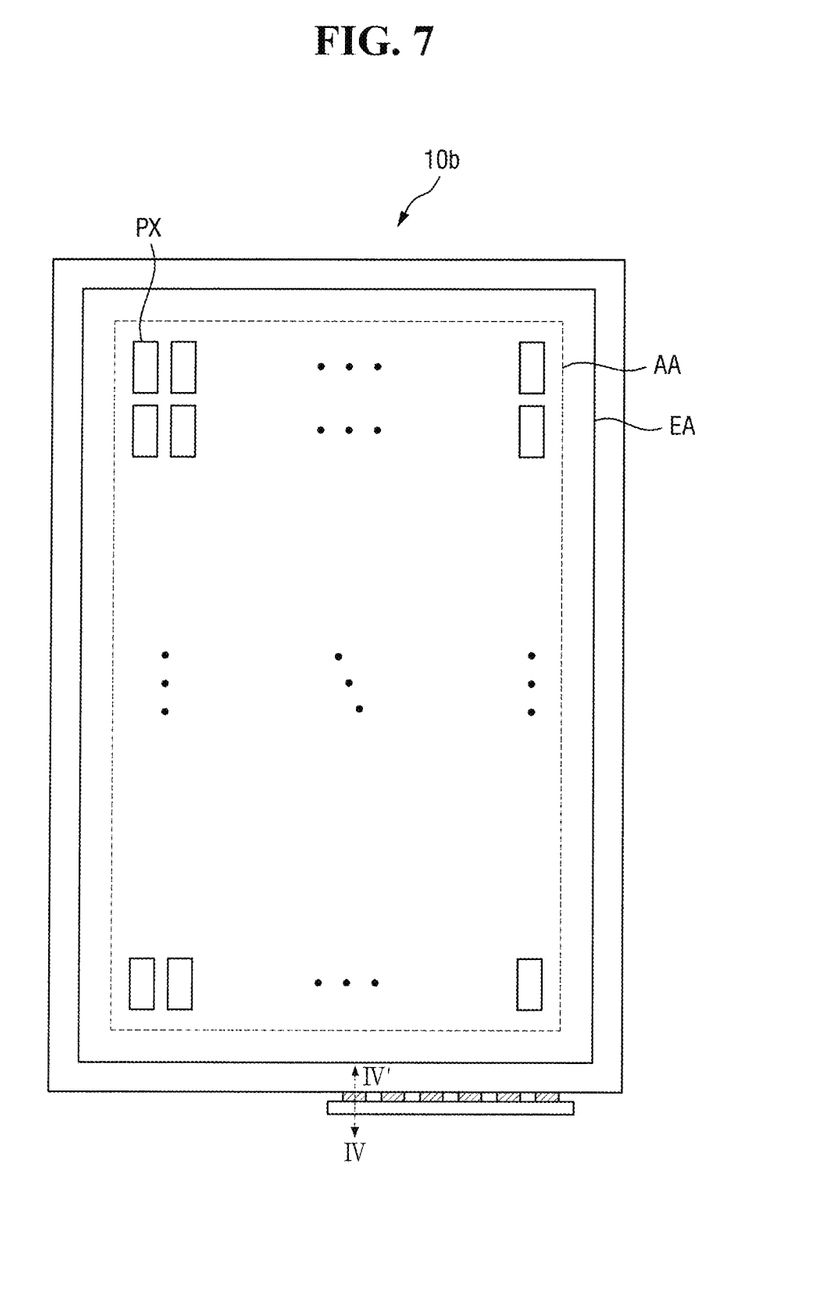
FIG. 7 is a layout view of a display panel according to an embodiment.
Figure 8:
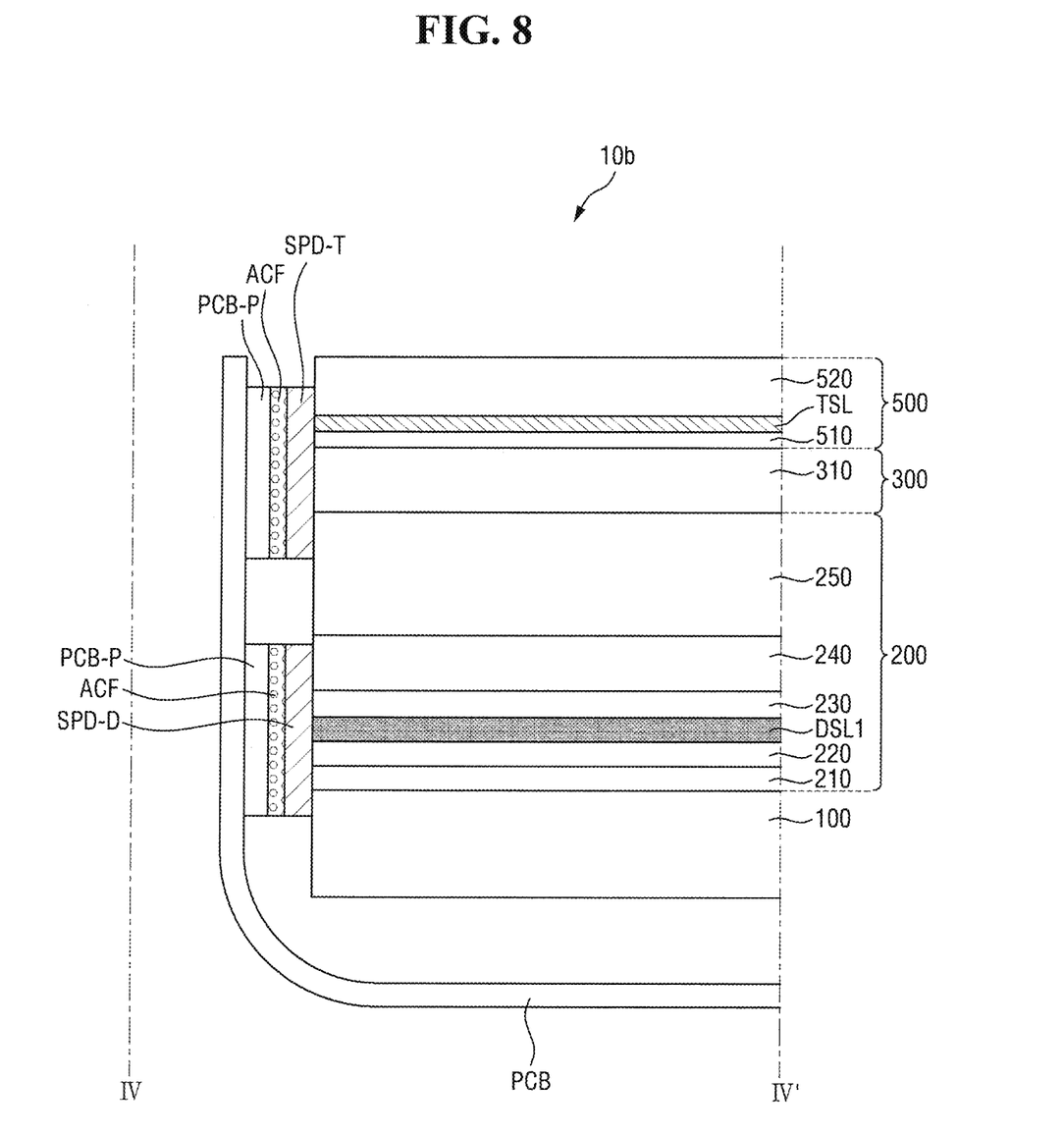
FIG. 8 is a cross-sectional view taken along the line IV-IV' of FIG. 7.

FIG. 7 is a layout view of a display panel 10*b* according to an embodiment. FIG. 8 is a cross-sectional view taken along the line IV-IV' of FIG. 7.

The display panel 10*b* according to the current embodiment is different from the display panel 10 (see FIG. 1) according to the embodiment of FIGS. 1 through 5 in the arrangement of display signal pads SPD-D and sensing signal pads SPD-T. Therefore, the arrangement of the display signal pads SPD-D and the sensing signal pads SPD-T will be mainly described in the current embodiment, and a description of elements and reference numerals identical to those described above will be omitted or simplified.

Referring to FIGS. 7 and 8, a first display signal line DSL1 and a sensing signal line TSL overlap each other. In addition, the display signal pads SPD-D and the sensing signal pads SPD-T may be arranged side by side on a sidewall of the display panel 10*b*. Accordingly, the area occupied by the display signal pads SPD-D and the sensing signal pads SPD-T on the sidewall of the display panel 10*b* can be minimized (or reduced), and an area in which a circuit board PCB is disposed can be minimized (or reduced).

Figure 9:
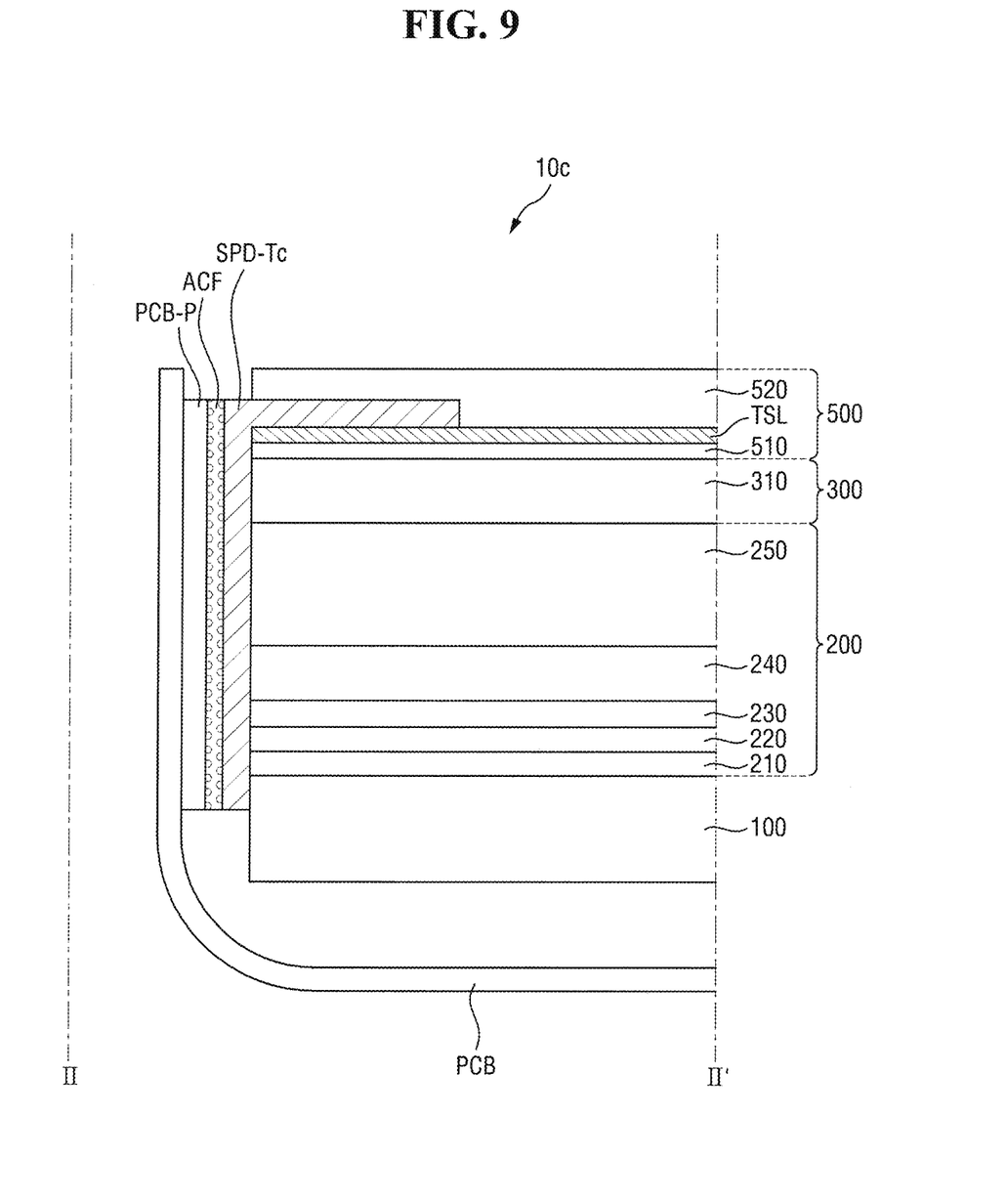
FIG. 9 is a cross-sectional view of a display panel according to an embodiment, taken along a line corresponding to the line II-II' of FIG. 1.

FIG. 9 is a cross-sectional view of a display panel 10*c* according to an embodiment, taken along a line corresponding to the line II-II' of FIG. 1.

The display panel 10*c* according to the current embodiment is different from the display panel 10 (see FIG. 1) according to the embodiment of FIGS. 1 through 5 in the structure of a sensing signal pad SPD-Tc. Therefore, the sensing signal pad SPD-Tc will be mainly described in the current embodiment, and a description of elements and reference numerals identical to those described above will be omitted or simplified.

Referring to FIG. 9, the sensing signal pad SPD-Tc is disposed not only on a sidewall of the display panel 10*c* according to the current embodiment but also on an edge of the display panel 10*c* to partially overlap a sensing signal line TSL. For example, since the sensing signal pad SPD-Tc is bent, it may be disposed on a portion of an upper surface of the sensing signal line TSL and along the sidewall of the display panel 10*c*.

Accordingly, the durability of the sensing signal pad SPD-Tc can be improved. For example, the disconnection of the sensing signal pad SPD-Tc from the sensing signal line TSL or the breaking of the sensing signal pad SPD-Tc and the sensing signal line TSL can be minimized (or reduced), and the sensing signal pad SPD-Tc can be more securely fixed to the sidewall of the display panel 10c.

According to embodiments, it is possible to provide a display panel in which the position of pads for signal transmission is adjusted to produce a display device having a thin bezel.

However, the effects of the embodiments are not restricted to the one set forth herein. The above and other effects of the embodiments will become more apparent to one of daily skill in the art to which the embodiments pertain by referencing the claims.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the subject matter of the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims, and equivalents thereof. The exemplary embodiments should be considered in a descriptive sense only and not for purposes of limitation.

What is claimed is:

1. A display panel comprising:
   a base layer in which a display area where a plurality of pixels are disposed and a non-display area surrounding the display area are defined;
   a circuit element layer which is disposed on the base layer;
   an input sensing layer which is disposed on the circuit element layer; and
   a plurality of display signal pads and a plurality of sensing signal pads which are disposed on a sidewall,
   wherein the sidewall is a single plane defined by, each of the base layer, the circuit element layer and the input sensing layer,
   wherein the sidewall extends in a first direction which is perpendicular to a second direction, the second direction being a direction in which the base layer, the circuit element layer, and the input sensing layer are stacked,
   wherein the sidewall comprises a first pad area and a second pad area which is separated from the first pad area, the first pad area and the second pad area being arranged in the first direction,
   wherein each of the display signal pads is electrically coupled to a display signal line disposed in the circuit element layer, and each of the sensing signal pads is electrically coupled to an input sensing line disposed in the input sensing layer,
   wherein the plurality of display signal pads are disposed in the first pad area, and
   wherein the plurality of sensing signal pads are disposed in the second pad area.

2. The display panel of claim 1, further comprising a circuit board which is spaced apart from the base layer, the circuit element layer and the input sensing layer, wherein the circuit board is disposed side by side with the sidewall defined by each of the base layer, the circuit element layer and the input sensing layer.

3. The display panel of claim 2, further comprising a plurality of circuit board pads which are electrically coupled to the display signal pads or the sensing signal pads.

4. The display panel of claim 3, wherein an anisotropic conductive film is disposed between each of the circuit board pads and each of the display signal pads or each of the sensing signal pads.

5. The display panel of claim 1, wherein the input sensing layer further comprises a sensing electrode.

6. The display panel of claim 5, wherein the input sensing line provides information about an external input, which is provided to the sensing electrode, to each of the sensing signal pads.

7. The display panel of claim 5, wherein the sensing electrode has a mesh shape.

8. The display panel of claim 7, wherein each of the pixels comprises a light emitting area in which an organic light emitting diode is disposed and a non-light emitting area outside the light emitting area, wherein the sensing electrode is disposed in the non-light emitting area.

9. The display panel of claim 1, further comprising a thin-film encapsulating layer which is disposed between the circuit element layer and the input sensing layer.

10. The display panel of claim 9, wherein the thin film encapsulating layer is disposed in a thin-film encapsulating area which overlaps the display area and a part of the non-display area.

11. The display panel of claim 8, wherein each of the pixels further comprises a driving transistor, a switching transistor and the organic light emitting diode, wherein a control electrode of the driving transistor and a control electrode of the switching transistor are disposed on the same layer and formed of the same or substantially the same material as the display signal line.

12. The display panel of claim 11, wherein the circuit element layer comprises a first intermediate inorganic film, a first conductive layer disposed on the first intermediate inorganic film, a second intermediate inorganic film disposed on the first conductive layer, and a second conductive layer disposed on the second intermediate inorganic film, wherein the control electrode of the driving transistor and the control electrode of the switching transistor are disposed in the first conductive layer.

13. The display panel of claim 12, further comprising a storage electrode which overlaps the control electrode of the switching transistor, wherein the storage electrode is disposed in the second conductive layer.

14. The display panel of claim 13, wherein the display signal line is formed as a part of the first conductive layer and a part of the second conductive layer which is disposed on an upper surface of the first conductive layer to overlap the upper surface of the first conductive layer.

15. The display panel of claim 1, further comprising a display element layer which is disposed between the circuit element layer and the input sensing layer.

16. The display panel of claim 15, wherein the display element layer comprises an organic light emitting diode.

17. The display panel of claim 1, wherein each of the display sensing signal pads is bent to contact an upper surface of the input sensing line.

18. The display panel of claim 1, wherein the display signal line and the input sensing line overlap each other, and the display signal pads and the sensing signal pads are disposed side by side along the sidewall defined by each of the base layer, the circuit element layer and the input sensing layer.

19. The display panel of claim 1, wherein the base layer is a synthetic resin layer.

20. The display panel of claim 1, further comprising a cover layer which is disposed on the input sensing layer, wherein the base layer and the cover layer are rigid.

* * * * *